United States Patent
Li et al.

(10) Patent No.: US 7,355,728 B2
(45) Date of Patent: Apr. 8, 2008

(54) OPTICAL METROLOGY MODEL OPTIMIZATION FOR REPETITIVE STRUCTURES

(75) Inventors: Shifang Li, Pleasanton, CA (US); Junwei Bao, Fremont, CA (US); Hong Qui, Union City, CA (US); Victor Liu, Sunnyvale, CA (US)

(73) Assignee: Timbre Technologies, Inc., Santa Clara, CA (US)

( * ) Notice: Subject to any disclaimer, the term of this patent is extended or adjusted under 35 U.S.C. 154(b) by 265 days.

(21) Appl. No.: 11/155,406

(22) Filed: Jun. 16, 2005

(65) Prior Publication Data

US 2006/0290947 A1 Dec. 28, 2006

(51) Int. Cl.
G01B 11/14 (2006.01)
(52) U.S. Cl. .............. 356/625; 700/121; 356/601
(58) Field of Classification Search ........ 356/601, 356/625, 636, 237.1, 237.5; 700/121
See application file for complete search history.

(56) References Cited

U.S. PATENT DOCUMENTS

| | | | |
|---|---|---|---|
| 5,326,659 A | 7/1994 | Liu et al. | |
| 5,442,676 A | 8/1995 | Fewster et al. | |
| 5,719,796 A | 2/1998 | Chen | |
| 5,805,290 A | 9/1998 | Ausschnitt et al. | |
| 5,963,329 A | 10/1999 | Conrad et al. | |
| 6,130,750 A | 10/2000 | Ausschnitt et al. | |
| 6,317,211 B1 | 11/2001 | Ausschnitt et al. | |
| 6,334,209 B1 | 12/2001 | Hashimoto et al. | |
| 6,470,230 B1 | 10/2002 | Toprac et al. | |
| 6,532,428 B1 | 3/2003 | Toprac | |
| 6,609,086 B1 | 8/2003 | Bao et al. | |
| 6,622,059 B1 | 9/2003 | Toprac et al. | |
| 6,636,843 B2 | 10/2003 | Doddi et al. | |
| 6,704,661 B1 | 3/2004 | Opsal et al. | |
| 6,748,104 B1 | 6/2004 | Bachelder et al. | |
| 6,768,983 B1 | 7/2004 | Jakatdar et al. | |

(Continued)

OTHER PUBLICATIONS

Li, Lifeng. (1996) "Formulation and Comparison of Two Recursive Matrix Algorithms for Modeling Layered Diffraction Grating." J. Opt. Soc. Am. A13, pp. 1024-1035.

(Continued)

*Primary Examiner*—Layla G. Lauchman
*Assistant Examiner*—Rebecca C. Slomski
(74) *Attorney, Agent, or Firm*—Morrison & Foerster LLP

(57) ABSTRACT

An optical metrology model for a repetitive structure is optimized by selecting one or more profile parameters using one or more selection criteria. One or more termination criteria are set, the one or more termination criteria comprising measures of stability of the optical metrology model. The profile shape features of the repetitive structure are characterized using the one or more selected profile parameters. The optical metrology model is optimized using a set of values for the one or more selected profile parameters. One or more profile parameters of the profile of the repetitive structure are determined using the optimized optical metrology model and one or more measured diffraction signals. Values of the one or more termination criteria are calculated using the one or more determined profile parameters. When the calculated values of the one or more termination criteria do not match the one or more set termination criteria, the selection of the one or more profile parameters and/or the characterization of the profile shape features of the repetitive structure are revised.

33 Claims, 9 Drawing Sheets

U.S. PATENT DOCUMENTS

| | | |
|---|---|---|
| 6,778,911 B2 | 8/2004 | Opsal et al. |
| 6,785,638 B2 | 8/2004 | Niu et al. |
| 6,867,866 B1 | 3/2005 | Chang et al. |
| 6,891,626 B2 | 5/2005 | Niu et al. |
| 6,900,892 B2 | 5/2005 | Shchegrov et al. |
| 6,943,900 B2 | 9/2005 | Niu et al. |
| 6,954,911 B2 | 10/2005 | Pierrat |
| 2003/0225535 A1 | 12/2003 | Doddi et al. |
| 2004/0017574 A1 | 1/2004 | Vuong et al. |
| 2004/0017575 A1* | 1/2004 | Balasubramanian et al. .......... 356/625 |
| 2004/0078173 A1 | 4/2004 | Bischoff et al. |
| 2004/0267397 A1 | 12/2004 | Doddi et al. |
| 2005/0057748 A1* | 3/2005 | Vuong et al. ............ 356/237.5 |
| 2005/0209816 A1 | 9/2005 | Vuong et al. |

OTHER PUBLICATIONS

International Search Report mailed Mar. 17, 2004, for PCT patent application No. PCT/US03/23281 filed Jul. 25, 2003, 4 pages.

International Search Report mailed Feb. 18, 2005, for PCT patent application No. PCT/US2004/009453, filed Mar. 25, 2004, 4 pages.

* cited by examiner

Unit Cell - 260

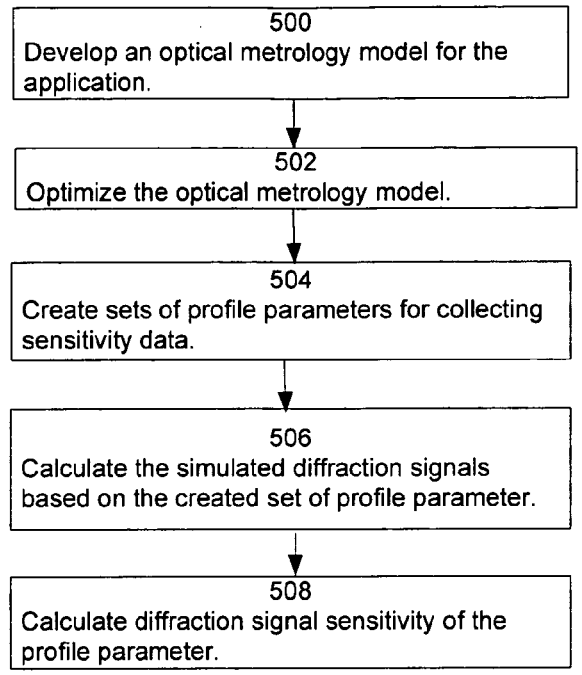
FIG. 6
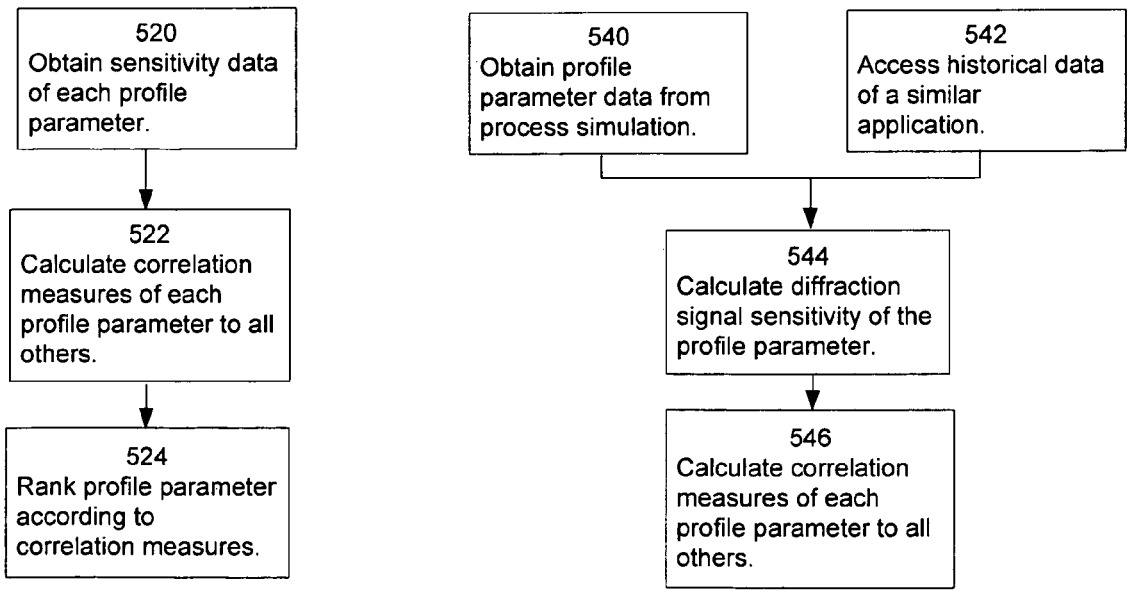
FIG. 7
FIG. 8

OPTICAL METROLOGY MODEL OPTIMIZATION FOR REPETITIVE STRUCTURES

BACKGROUND

1. Field

The present application relates to optical metrology, and more particularly to optical metrology model optimization for repetitive structures.

2. Related Art

Optical metrology involves directing an incident beam at a structure, measuring the resulting diffracted beam, and analyzing the diffracted beam to determine various characteristics, such as the profile of the structure. In semiconductor manufacturing, optical metrology is typically used for quality assurance. For example, after fabricating a periodic grating structure in proximity to a semiconductor chip on a semiconductor wafer, an optical metrology system is used to determine the profile of the periodic grating. By determining the profile of the periodic grating structure, the quality of the fabrication process utilized to form the periodic grating structure, and by extension the semiconductor chip proximate the periodic grating structure, can be evaluated.

In optical metrology, an optical metrology model is typically developed to measure a structure. The optical metrology model can be expressed using optical metrology variables. In general, the greater the number of optical metrology variables that are allowed to float in developing the optical metrology model, the better the fitting of the measurements signal obtained to the simulated signal using the optical metrology model. However, increasing the number of optical metrology variables allowed to float also increases the amount of time needed to develop the optical metrology model. Additionally, in some cases, allowing too many optical metrology variables can produce erroneous measurements, due to correlation between the optical metrology variables. In some cases, floating correlated or insensitive optical metrology variables may also result in unstable and erroneous measurements.

SUMMARY

In one exemplary embodiment, an optical metrology model for a repetitive structure is optimized by selecting one or more profile parameters using one or more selection criteria. One or more termination criteria are set, the one or more termination criteria comprising measures of stability of the optical metrology model. The profile shape features of the repetitive structure are characterized using the one or more selected profile parameters. The optical metrology model is optimized using a set of values for the one or more selected profile parameters. One or more profile parameters of the profile of the repetitive structure are determined using the optimized optical metrology model and one or more measured diffraction signals. Values of the one or more termination criteria are calculated using the one or more determined profile parameters. When the calculated values of the one or more termination criteria do not match the one or more set termination criteria, the selection of the one or more profile parameters and/or the characterization of the profile shape features of the repetitive structure are revised.

DESCRIPTION OF DRAWING FIGURES

The present application can be best understood by reference to the following description taken in conjunction with the accompanying drawing figures, in which like parts may be referred to by like numerals:

FIG. 6 is a block diagram of an exemplary method for collecting and calculating sensitivity data for profile parameter of repeating structures;

FIG. 7 is a block diagram of an exemplary method for collecting and calculating correlation data for profile parameters of repeating structures;

FIG. 8 is a block diagram of an exemplary method for collecting and calculating sensitivity and correlation data for repeating structures using process simulation and using historical data;

DETAILED DESCRIPTION

The following description sets forth numerous specific configurations, parameters, and the like. It should be recognized, however, that such description is not intended as a limitation on the scope of the present invention, but is instead provided as a description of exemplary embodiments.

1. Optical Metrology

Figure 1:
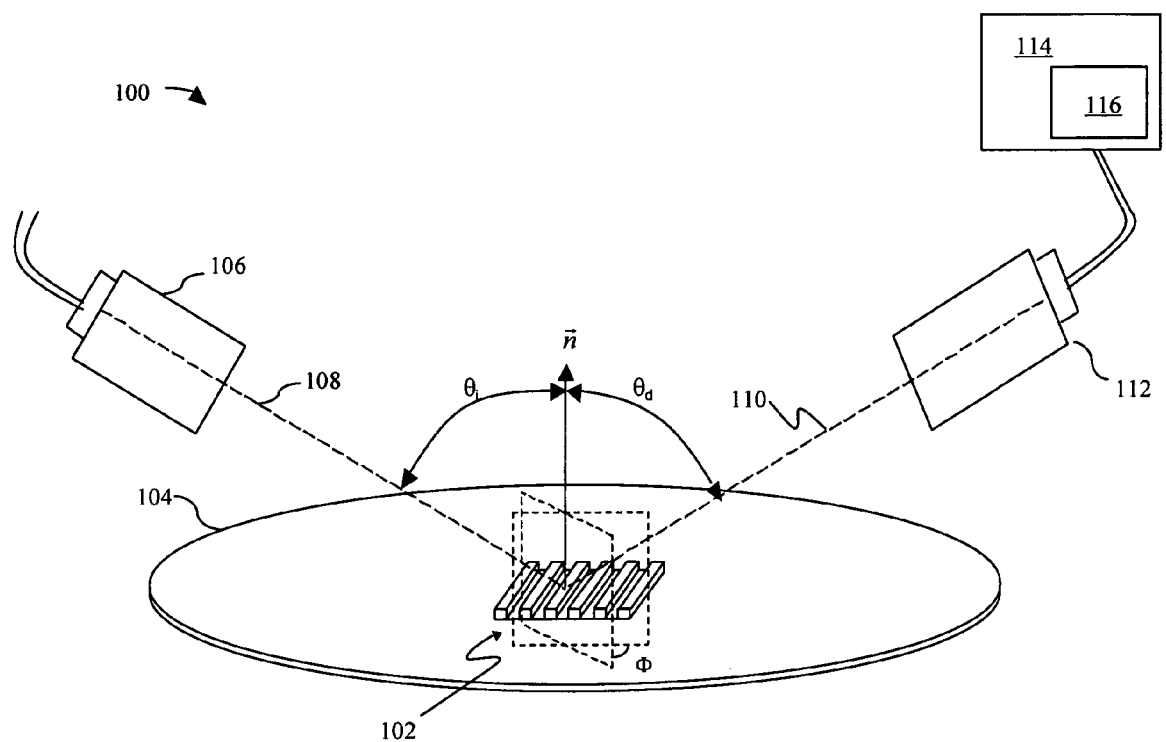
FIG. 1 is a block diagram of an exemplary optical metrology system.

With reference to FIG. 1, an optical metrology system 100 can be used to examine and analyze a structure. For example, optical metrology system 100 can be used to determine the profile of a periodic grating 102 formed on wafer 104. As described earlier, periodic grating 102 can be formed in test areas on wafer 104, such as adjacent to a device formed on wafer 104. Alternatively, periodic grating 102 can be formed in an area of the device that does not interfere with the operation of the device or along scribe lines on wafer 104.

As depicted in FIG. 1, optical metrology system 100 can include a photometric device with a source 106 and a detector 112. Periodic grating 102 is illuminated by an incident beam 108 from source 106. In the present exemplary embodiment, incident beam 108 is directed onto periodic grating 102 at an angle of incidence $\theta_i$ with respect to normal $\vec{n}$ of periodic grating 102 and an azimuth angle $\Phi$ (i.e., the angle between the plane of incidence beam 108 and the direction of the periodicity of periodic grating 102). Diffracted beam 110 leaves at an angle of $\theta_d$ with respect to normal $\vec{n}$ and is received by detector 112. Detector 112 converts the diffracted beam 110 into a measured diffraction signal.

To determine the profile of periodic grating 102, optical metrology system 100 includes a processing module 114 configured to receive the measured diffraction signal and analyze the measured diffraction signal. As described below, the profile of periodic grating 102 can then be determined using a library-based process or a regression-based process. Additionally, other linear or non-linear profile extraction techniques are contemplated.

2. Library-Based Process of Determining Profile of Structure

In a library-based process of determining the profile of a structure, the measured diffraction signal is compared to a library of simulated diffraction signals. More specifically, each simulated diffraction signal in the library is associated with a hypothetical profile of the structure. When a match is made between the measured diffraction signal and one of the simulated diffraction signals in the library or when the difference of the measured diffraction signal and one of the simulated diffraction signals is within a preset or matching criterion, the hypothetical profile associated with the matching simulated diffraction signal is presumed to represent the actual profile of the structure. The matching simulated diffraction signal and/or hypothetical profile can then be utilized to determine whether the structure has been fabricated according to specifications.

Thus, with reference again to FIG. 1, in one exemplary embodiment, after obtaining a measured diffraction signal, processing module 114 then compares the measured diffraction signal to simulated diffraction signals stored in a library 1116. Each simulated diffraction signal in library 116 can be associated with a hypothetical profile. Thus, when a match is made between the measured diffraction signal and one of the simulated diffraction signals in library 116, the hypothetical profile associated with the matching simulated diffraction signal can be presumed to represent the actual profile of periodic grating 102.

The set of hypothetical profiles stored in library 116 can be generated by characterizing a hypothetical profile using a set of profile parameters, then varying the set of profile parameters to generate hypothetical profiles of varying shapes and dimensions. The process of characterizing a profile using a set of profile parameters can be referred to as parameterizing.

Figure 2A:
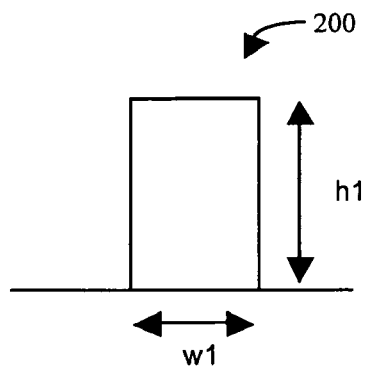
FIGS. 2A-2E are exemplary profiles that characterize a structure on a semiconductor wafer.
Figure 2B:
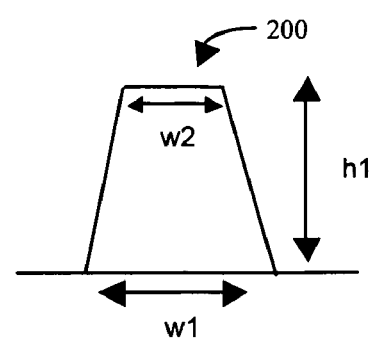
Figure 2C:
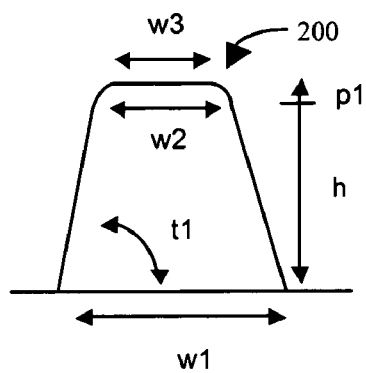
Figure 2D:
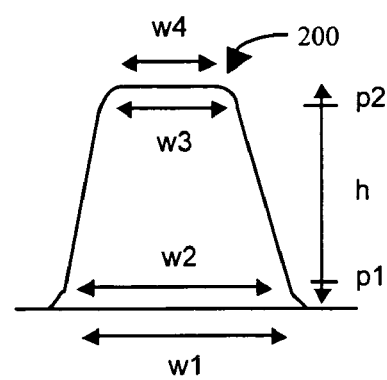
Figure 2E:
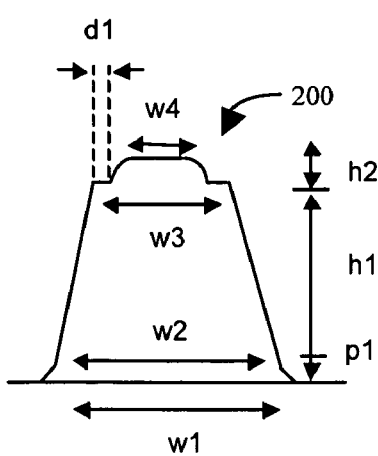

For example, as depicted in FIG. 2A, assume that hypothetical profile 200 can be characterized by profile parameters h1 and w1 that define its height and width, respectively. As depicted in FIGS. 2B to 2E, additional shapes and features of hypothetical profile 200 can be characterized by increasing the number of profile parameters. For example, as depicted in FIG. 2B, hypothetical profile 200 can be characterized by profile parameters h1, w1, and w2 that define its height, bottom width, and top width, respectively. Note that the width of hypothetical profile 200 can be referred to as the critical dimension (CD). For example, in FIG. 2B, profile parameter w1 and w2 can be described as defining the bottom CD and top CD, respectively, of hypothetical profile 200.

As described above, the set of hypothetical profiles stored in library 116 (FIG. 1) can be generated by varying the profile parameters that characterize the hypothetical profile. For example, with reference to FIG. 2B, by varying profile parameters h1, w1, and w2, hypothetical profiles of varying shapes and dimensions can be generated. Note that one, two, or all three profile parameters can be varied relative to one another.

With reference again to FIG. 1, the number of hypothetical profiles and corresponding simulated diffraction signals in the set of hypothetical profiles and simulated diffraction signals stored in library 116 (i.e., the resolution and/or range of library 116) depends, in part, on the range over which the set of profile parameters and the increment at which the set of profile parameters are varied. In one exemplary embodiment, the hypothetical profiles and the simulated diffraction signals stored in library 116 are generated prior to obtaining a measured diffraction signal from an actual structure. Thus, the range and increment (i.e., the range and resolution) used in generating library 116 can be selected based on familiarity with the fabrication process for a structure and what the range of variance is likely to be. The range and/or resolution of library 116 can also be selected based on empirical measures, such as measurements using atomic force microscope (AFM), or a cross section scanning electron microscope (XSEM), a transmission electron microscope (TEM), and the like.

For a more detailed description of a library-based process, see U.S. patent application Ser. No. 09/907,488, titled GENERATION OF A LIBRARY OF PERIODIC GRATING DIFFRACTION SIGNALS, filed on Jul. 16, 2001, which is incorporated herein by reference in its entirety.

3. Regression-Based Process of Determining Profile of Structure

In a regression-based process of determining the profile of a structure, the measured diffraction signal is compared to a simulated diffraction signal (i.e., a trial diffraction signal). The simulated diffraction signal is generated prior to the comparison using a set of profile parameters (i.e., trial parameters) for a hypothetical profile (i.e., a hypothetical profile). If the measured diffraction signal and the simulated diffraction signal do not match or when the difference of the measured diffraction signal and one of the simulated diffraction signals is not within a preset or matching criterion, another simulated diffraction signal is generated using another set of profile parameters for another hypothetical profile, then the measured diffraction signal and the newly generated simulated diffraction signal are compared. When the measured diffraction signal and the simulated diffraction signal match or when the difference of the measured diffraction signal and one of the simulated diffraction signals is within a preset or matching criterion, the hypothetical profile associated with the matching simulated diffraction signal is presumed to represent the actual profile of the structure. The matching simulated diffraction signal and/or hypothetical profile can then be utilized to determine whether the structure has been fabricated according to specifications.

Thus, with reference again to FIG. 1, in one exemplary embodiment, processing module 114 can generate a simulated diffraction signal for a hypothetical profile, and then compare the measured diffraction signal to the simulated diffraction signal. As described above, if the measured diffraction signal and the simulated diffraction signal do not match or when the difference of the measured diffraction signal and one of the simulated diffraction signals is not within a preset or matching criterion, then processing module 114 can iteratively generate another simulated diffraction signal for another hypothetical profile. In one exemplary embodiment, the subsequently generated simulated diffraction signal can be generated using an optimization algorithm, such as global optimization techniques, which includes simulated annealing, and local optimization techniques, which includes steepest descent algorithm.

In one exemplary embodiment, the simulated diffraction signals and hypothetical profiles can be stored in a library 116 (i.e., a dynamic library). The simulated diffraction signals and hypothetical profiles stored in library 116 can then be subsequently used in matching the measured diffraction signal.

For a more detailed description of a regression-based process, see U.S. patent application Ser. No. 09/923,578, titled METHOD AND SYSTEM OF DYNAMIC LEARNING THROUGH A REGRESSION-BASED LIBRARY GENERATION PROCESS, filed on Aug. 6, 2001, now U.S. Pat. No. 6,785,638, issued Aug. 31, 2004, which is incorporated herein by reference in its entirety.

4. Algorithm for Determining Simulated Diffraction Signal

As described above, simulated diffraction signals are generated to be compared to measured diffraction signals. As will be described below, in one exemplary embodiment, simulated diffraction signals can be generated by applying Maxwell's equations and using a numerical analysis technique to solve Maxwell's equations. More particularly, in the exemplary embodiment described below, rigorous coupled-wave analysis (RCWA) is used. It should be noted, however, that various numerical analysis techniques, including variations of RCWA, modal analysis, integral method, Green's functions, Fresnel method, finite element and the like can be used.

In general, RCWA involves dividing a profile into a number of sections, slices, or slabs (hereafter simply referred to as sections). For each section of the profile, a system of coupled differential equations generated using a Fourier expansion of Maxwell's equations (i.e., the features of the electromagnetic field and permittivity ($\epsilon$)). The system of differential equations is then solved using a diagonalization procedure that involves eigenvalue and eigenvector decomposition (i.e., Eigen-decomposition) of the characteristic matrix of the related differential equation system. Finally, the solutions for each section of the profile are coupled using a recursive-coupling schema, such as a scattering matrix approach. For a description of a scattering matrix approach, see Lifeng Li, "Formulation and comparison of two recursive matrix algorithms for modeling layered diffraction gratings," J. Opt. Soc. Am. A13, pp 1024-1035 (1996), which is incorporated herein by reference in its entirety. Specifically for a more detail description of RCWA, see U.S. patent application Ser. No. 09/770,997, titled CACHING OF INTRA-LAYER CALCULATIONS FOR RAPID RIGOROUS COUPLED-WAVE ANALYSES, filed on Jan. 25, 2001, now U.S. Pat. No. 6,891,626, issued May 10, 2005, which is incorporated herein by reference in its entirety.

5. Machine Learning Systems

In one exemplary embodiment, simulated diffraction signals can be generated using a machine learning system (MLS) employing a machine learning algorithm, such as back-propagation, radial basis function, support vector, kernel regression, and the like. For a more detailed description of machine learning systems and algorithms, see "Neural Networks" by Simon Haykin, Prentice Hall, 1999, which is incorporated herein by reference in its entirety. See also U.S. patent application Ser. No. 10/608,300, titled OPTICAL METROLOGY OF STRUCTURES FORMED ON SEMICONDUCTOR WAFERS USING MACHINE LEARNING SYSTEMS, filed on Jun. 27, 2003, which is incorporated herein by reference in its entirety.

6. Repeating Structure

Figure 3A:
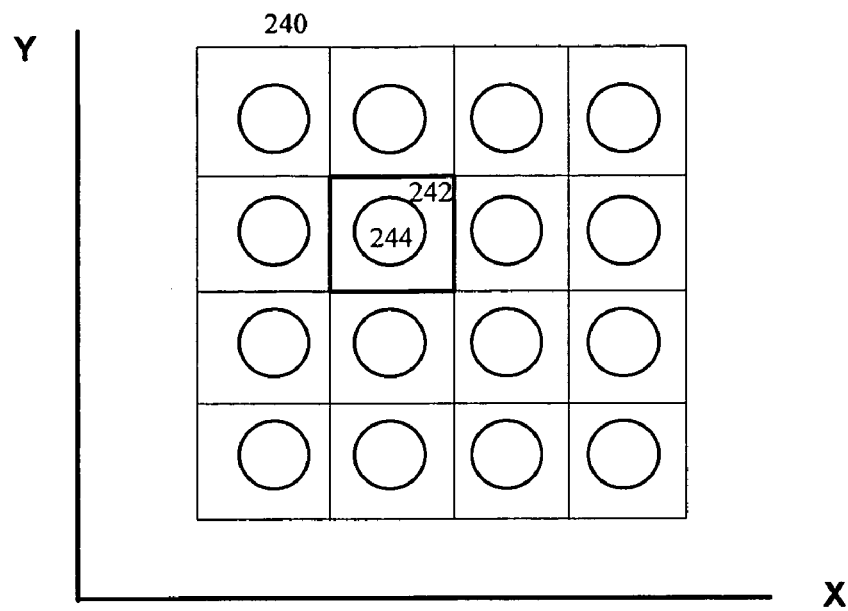
FIG. 3A-3B depict exemplary profiles of repeating structures.
Figure 3B:
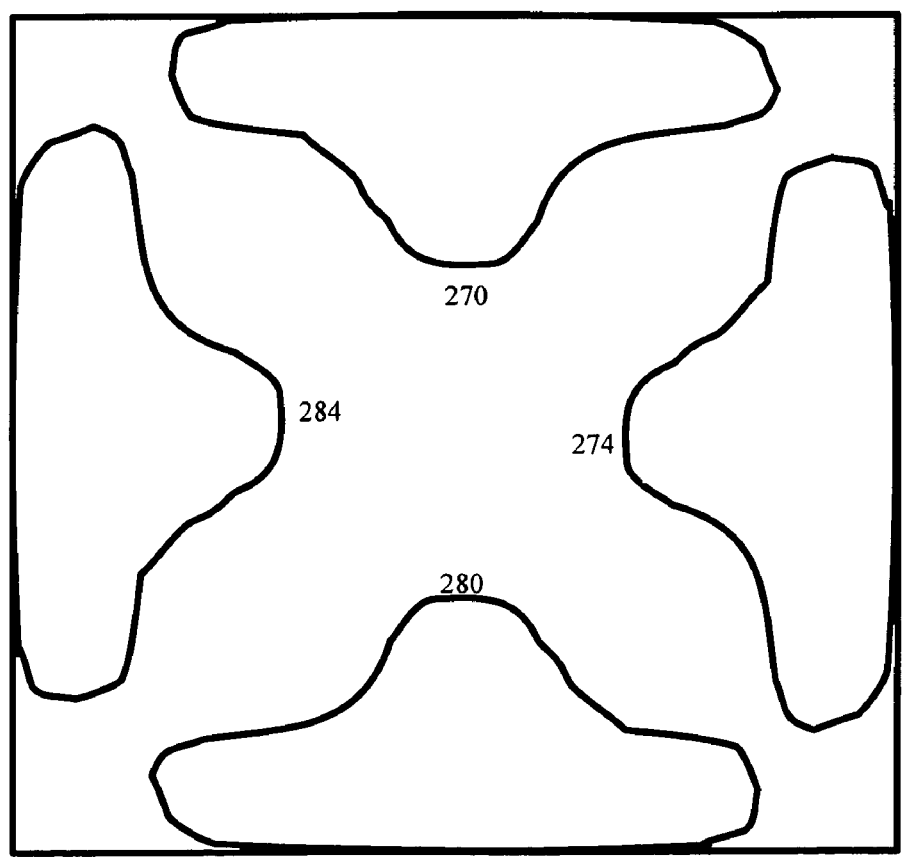
Figure 4A:
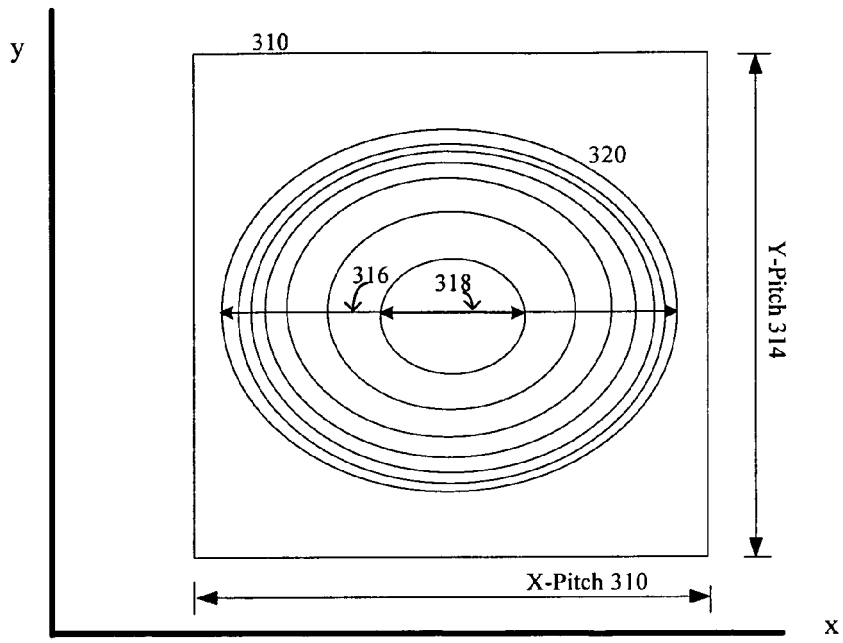
FIG. 4A depicts the top view profile of a repeating structure and 4B depicts the cross sectional view of the repeating structure.
Figure 4B:
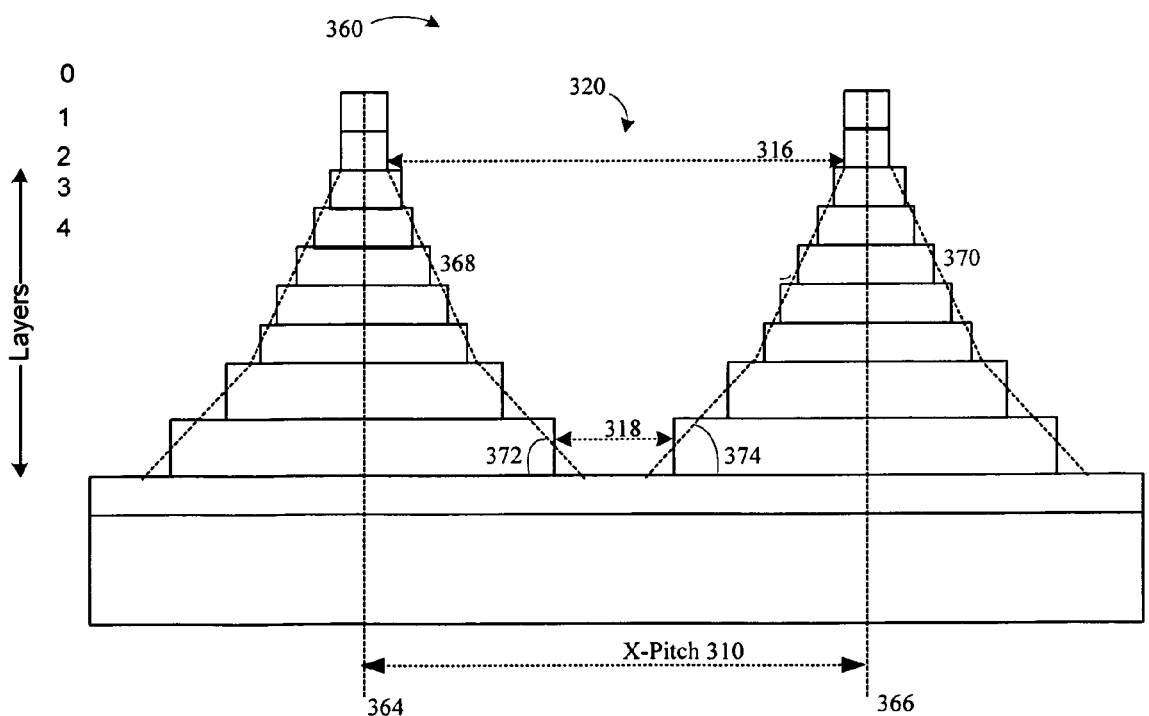

Optical metrology traditionally was applied to lines and spaces of gratings. In one exemplary embodiment, profile parameters of repeating structures can be extracted, where the features of an area designated as a unit cell may comprise a variety of shapes and configurations. FIGS. 3A and 3B depict examples of repeating structures and FIGS. 4A and 4B depict the profile parameters typically used to characterize the top-view and cross-sectional view of the repeating structures. Selected profile parameters of the repeating structures are integrated into the set of profile parameters used in the optical metrology model to simulate the diffraction signal.

FIG. 3A depicts a top-view of an exemplary repeating structure 240. A hypothetical grid of lines is superimposed on the top-view of the repeating structure 240 where the lines of the grid are drawn along the direction of periodicity. The repeating structure 240 in FIG. 3A has two directions of periodicity, one along each of the X-axis and the Y-axis. If the angle between the two directions of the periodicity is 90 degrees, the repeating structure is referred to as an orthogonal repeating structure; otherwise, it is referred to as a non-orthogonal repeating structure. In FIG. 3A, the hypothetical grid of lines forms areas referred to as unit cells, exemplified by unit cell 242, where the feature, a hole 244, is substantially in the center of the unit cell 242. However, it is understood that the hole 244 may be positioned anywhere in the unit cell 242. A unit cell may have one or more features and the features may have different shapes. For example, a unit cell may have features including a hole with an island inside the hole.

FIG. 3B depicts an exemplary unit cell comprising more than one feature. For example, unit cell 260 includes four features. Feature 270 is a pie-shaped structure with the bulge extending centrally below the main portion of the structure. Feature 280 is also a pie-shaped structure with the bulge extending centrally above the main portion of structure. Thus, in this example, feature 280 has a mirror image shape similar to feature 270. Feature 284 is a pie-shaped structure with the bulge extending to the right of the main portion. Feature 274 is also a pie-shaped structure with the bulge extending to the left of the main portion. Thus, in this example, feature 274 has a mirror image shape similar to feature 284. As mentioned above, the features in a unit cell may be islands, posts, holes, vias, trenches, or combinations of the above. Furthermore, the features may have a variety of shapes and may be concave or convex features or a combination of concave and convex features.

With reference to FIG. 4A and FIG. 4B, in another exemplary embodiment, the top-view and cross-sectional profile of a repeating structure are characterized using profile parameters. FIG. 4A depicts a top-view of a unit cell and FIG. 4B depicts the cross-sectional profile of the repeating structure that includes an exemplary unit cell. FIG. 4A shows a unit cell 310 with a feature 320 that comprises an elliptical hole, where the dimensions of the hole become progressively smaller until the bottom of the hole. Profile parameters used to characterize the structure includes the X-pitch 310 and the Y-pitch 314. In addition, the major axis of the ellipse 316 that represents the top of the feature 320 and the major axis of the ellipse 318 that represents the bottom of the feature 320 may be used to characterize the feature 320. Furthermore, any intermediate major axis between the top and bottom of the feature may also be used as well as any minor axis of the top, intermediate, or bottom ellipse, (not shown).

With reference to FIG. 4B, depicted is the cross-sectional profile of the repeating structure where one unit cell 310 as depicted in FIG. 4A is shown. As mentioned above, the cross-sectional profile typically defined for analysis purposes represents the profile of the structure in the X-Z plane, with the Z-axis being normal to the wafer surface. The X-pitch 310 of the repeating structure 360 is the distance between the centers of two of the adjacent features 368 and 370. For illustration purposes, a dotted vertical line 364 is drawn through the center of feature 368 and another dotted vertical line 366 is drawn through the center of feature 370. The X-pitch 310 is the distance, typically in nanometers, nm, between the dotted vertical line 364 through feature 368 and the dotted vertical line 366 through feature 370. Features 368 and 370 are divided into layers, starting with layer 0, layer 1, layer 2, etc. Layer 0 may include air, layer 1 of material 1, layer 2 of material 3, etc. Layer 0 has an n and k of air, layer 1 has the n and k of material 1, etc. The distance 316 between the features 368 and 370 is the same as the major axis 316 of the top of the feature, hole 320 in FIG. 4A. Similarly, the distance 318 of features 368 and 370 at the base of the feature 320 is the same as the major axis 318 of the bottom of the feature, hole 320 in FIG. 4A. The slope of the hole 320 is indicated by the angles 372 and 374. As will be discussed below, profile parameters such as X-pitch, Y-pitch, top-view dimensions of the features, slope of the features, layer thickness, and refractive indices (N and K) of the layers are integrated in the optical metrology model. Integration of top-view and cross-sectional profile parameters is explained in detail in U.S. patent application Ser. No. 10/274,252, titled GENERATING SIMULATED DIFFRACTION SIGNALS FOR TWO-DIMENSIONAL STRUCTURES, filed on Oct. 17, 2002, which is incorporated herein by reference in its entirety.

Other profile parameters associated with repeating structures is the position of the feature in the unit cell. For example, a feature, instead of being positioned in the center of unit cell, may be situated a distance above or below the center and to the right or to the left of the center of the unit cell. In addition to the parameters for repeating structures discussed above, other parameters included in the characterization of the repeating structures are width ratio and rectangularity of the features in a unit cell. The width ratio parameter defines the amount of sharpness of the corners of the hole or island in the unit cell.

Another method of characterizing a feature of a unit cell is by utilizing a mathematical model of the feature. For example, the outer boundaries of a feature in a unit cell of a repeating structure, such as a contact hole or a post, can be described using one or more equations. In this modeling construct, a hole is a structure made of air, with a specific N and K much like an island is a structure with a different N and K. Therefore, a characterization of the boundaries of the features in a unit cell, such a hole, includes description of the shape and slope of the feature. For a detailed description of profile parameters for repeating structures, integration of top-view and cross-sectional view parameters, refer to U.S. patent application Ser. No. 11/061,303, titled OPTICAL METROLOGY OPTIMIZATION FOR REPETITIVE STRUCTURES, filed on Feb. 18, 2005, which is incorporated herein by reference in its entirety.

The optical metrology variables for repeating structures comprise metrology device variables, materials variables, and profile parameters. Metrology device variables include the type of incident beam, whether it is polarized or unpolarized, the type diffraction signal, whether intensity change or polarization state change are being measured, and the like. Material variables include refractive indices N and K for the layers of the structure. Profile parameters include top-view and cross-sectional view parameters. As mentioned above, top-view parameters include rectangularity, width ratio, pitch on the X axis, pitch on the Y axis, and the like. Cross-sectional view parameters can include sidewall angle, height of structure, thicknesses of underlying film layers, critical dimension at the top, middle, and bottom of the structure, shape features, and the like. Shape features include top rounding, footing, undercutting, T-topping, hemisphere, and the like.

As mentioned above, there is flexibility in how many profile parameters are used to characterize profile shape features in an optical metrology model. More profile parameters used to characterize a profile shape feature typically allows more variations and combinations of shapes. However, more profile parameters may also result in less stable or erroneous values obtained with the library or MLS approach of determining the profile parameters from measured diffraction signals. A stable optical metrology model for a repeating structure provides extracted profile parameters that are physically possible and are within the range of dimensions for a given semiconductor application. The range of dimensions of a profile parameter is typically determined using a reference device, such as a scanning electron microscope (SEM) or the like. Several causes of lack of stability of an optical metrology model include use of too many parameters to characterize a profile shape feature, inclusion of profile parameters that do not produce measurable changes to the diffraction signal, and high correlation of profile parameters to one or more of the other profile parameters in the model. Stability of an optical metrology model is greatly enhanced by use of a lower number of profile parameters required to represent a shape, with well known range of a profile parameter to one that is physically possible, substituting a fixed value to a variable profile parameter, and optimization of profile parameters by considering sensitivity and correlation of a parameter compared to the rest of the other parameters.

Application of the principles and concepts mentioned above is described in detail for exemplary common shape features of structures. FIG. 5A-5E depict exemplary instances of characterization of profile shape features, such as top-rounding, T-topping, footing, undercutting, and hemisphere.

Figure 5A:
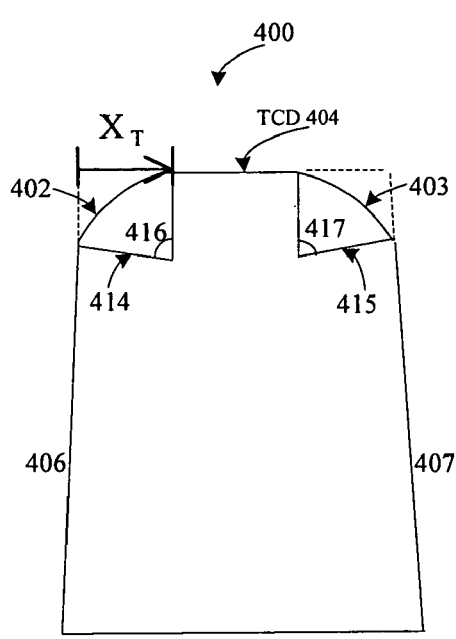
FIG. 5A-5E depict exemplary instances of characterization of profile shape features such as top-rounding, T-topping, footing, undercutting, and hemisphere.

FIG. 5A depicts an exemplary characterization of rounding of the top of a structure 400. Top-rounding may be defined by a pair of circular arcs, 402 and 403, that are tangential to the top CD (TCD) 404 of the structure and the two adjacent sidewall edges 406 and 407. Traditionally, profile parameters used for characterizing top-rounding may utilize arc 402 and a radius of rotation 414 and arc 403 and a rotation radius 415. Alternatively, arc 402 and an angle of rotation 416 and arc 403 and angle of rotation 417. Using the principles and concepts of one exemplary embodiment, a single profile parameter is used called the Distance Ratio for top-rounding (TR) as follows:

$$\text{DISTANCE RATIO}_{TR} = (X_T)/(\text{TCD}/2) \qquad 1.01.00$$

where $X_T$ is the distance from the point, where the adjacent sidewall edge 406 to the point, and where the circular arc 402 touches the TCD 404. The DISTANCE RATIO$_{TR}$ parameter characterizes the amount of top-rounding, varying from the default value of 0.0 for no top-rounding to 1.0 for fully-rounded edge. The distance $X_T$ can vary from a value of 0.0 and TCD/2.

Figure 5B:
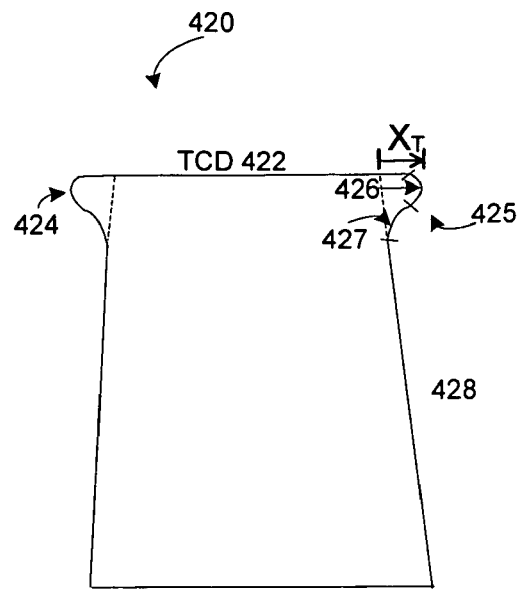

FIG. 5B depicts an exemplary characterization of a profile shape feature known as T-topping of a structure 420. T-topping may be defined by using two pairs of circular arcs 424 and 426. With reference to the right side of structure 420, the T-topping shape 425 include the first arc 426 that is tangential to the top of the profile shape and the second arc 427 is tangential to both the first arc 426 and the sidewall edge 428. A similar combination of two circular arcs (not shown) may be depicted in the left side of structure 420 for the T-topping shape 424. A single parameter may be used to characterize the T-topping (TT) such as DISTANCE RATIO$_{TT}$. The DISTANCE RATIO$_{TT}$ can vary from the default value of 0.0 for no T-topping to 1.0 for fully T-topped edge. The distance X$_T$ can vary from a value of 0.0 and (pitch−TCD)/2. The principles of T-topping described can be applied to other patterned profile shapes as long as the profile shape is the uppermost patterned shape. The DISTANCE RATIO$_{TT}$ is calculated using the following equation:

$$\text{DISTANCE RATIO}_{TT} = (X_T)/[(\text{pitch}-\text{TCD}/2)] \quad\quad 1.02.00$$

Figure 5C:
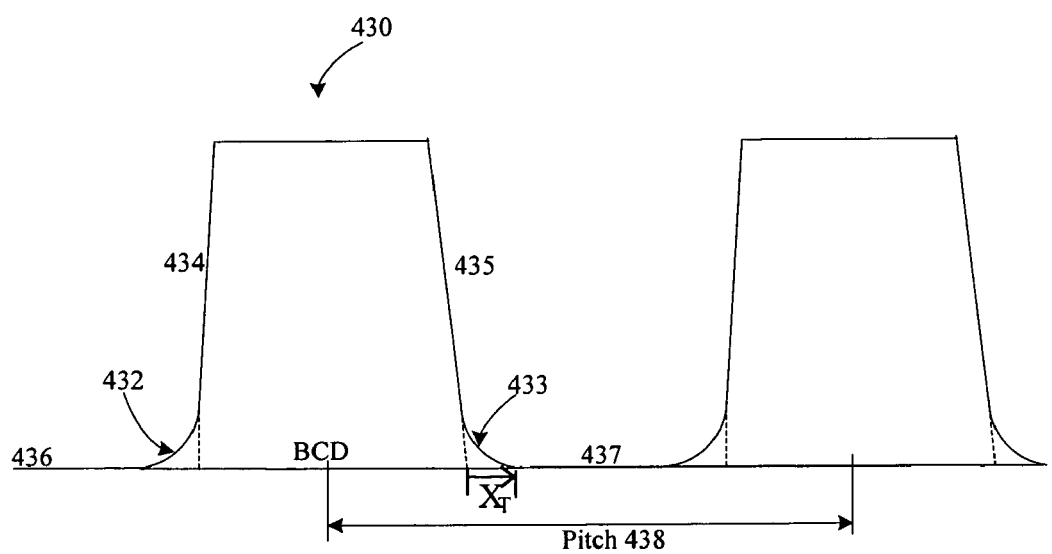

FIG. 5C depicts an exemplary characterization of a profile shape feature known as footing of a structure 430. Footing may be defined as a pair of circular arcs that are tangential to the bottom surface of the patterned trenches 436 and 437, and the two adjacent sidewall edges 434 and 435 of structure 430. A single parameter may be used to characterize footing such as DISTANCE RATIO$_F$ calculated utilizing the bottom CD (BCD), the pitch 438, and X$_T$. X$_T$ is the distance from the point where the adjacent edge would intersect the BCD and the point, where the arc 433 touches the patterned trench 437. The distance X$_T$ can vary from a value of 0.0 and ½(Pitch−BCD). The DISTANCE RATIO$_F$ may vary from a default value of 0.0 for no footing to 1.0 for a fully-footed edge. The principles of footing described can be applied to other patterned profile shapes as long as the profile shape is the lowermost patterned shape. The DISTANCE RATIO$_F$ is calculated in the following equation:

$$\text{DISTANCE RATIO}_F = (X_T)/[½(\text{Pitch}-\text{BCD})] \quad\quad 1.03.00$$

Figure 5D:
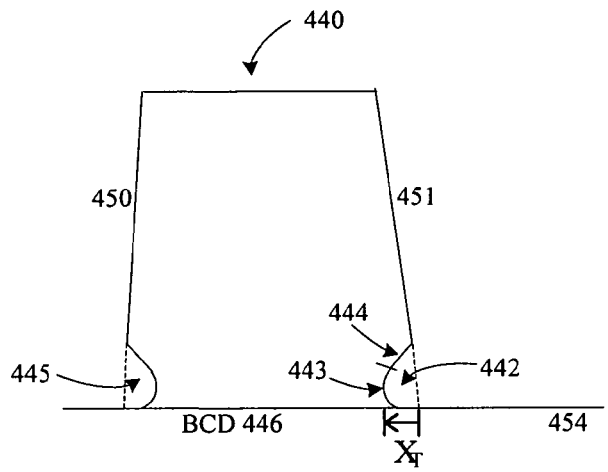

FIG. 5D depicts an exemplary characterization of a profile shape feature known as undercutting for a structure 440. Undercutting may be defined as two pairs of circular arcs 442 and 445. Referring to the right side of the structure 440 and the undercutting shape 442, the first arc 443 is tangential to the bottom width 446 of the profile shape and the second arc 444 is tangential to both the first arc 443 and the adjacent sidewall edge 451. A single parameter may be used to characterize the undercutting (UC), such the DISTANCE RATIO$_{UC}$ calculated from the BCD 446 and X$_T$. X$_T$ is the distance from the point where the adjacent edge 451 intersects the BCD 446 and the point, where the arc 443 touches the patterned trench 454. The distance X$_T$ can vary from a value of 0.0 to BCD/2. The DISTANCE RATIO$_{UC}$ may vary from a default value of 0.0 for no undercutting to 1.0 for a fully-undercut edge. The principles of undercutting described can be applied to other patterned profile shapes as long as the profile shape is the lowermost patterned shape. The DISTANCE RATIO$_{UC}$ is calculated in the following equation:

$$\text{DISTANCE RATIO}_{UC} = (X_T)/[\text{BCD}/2] \quad\quad 1.04.00$$

Figure 5E:
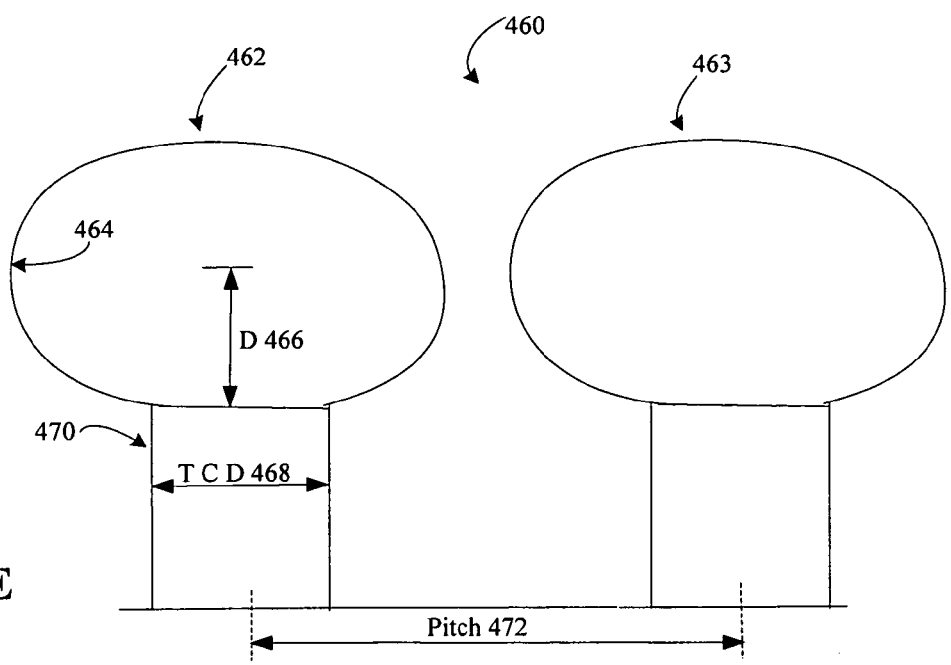
Figure 5F:
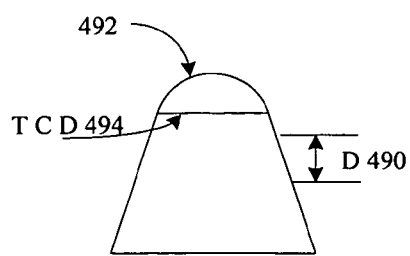

FIG. 5E depicts an exemplary characterization of a profile shape feature known as hemisphere for a repeating structure 460. Depicted are two adjacent structures 462 and 463 of the repeating structure 460 showing the pitch 472. Referring to FIG. 5E, an exemplary hemisphere 464 is positioned on top of a structure 470. The hemisphere may be a partial circle or elliptical; the hemisphere in structure 462 is an ellipse. In FIG. 5E, the complete hemisphere, an ellipse 464 is above the structure 470, however, it is understood that only a portion of a hemisphere may be above the structure 470 as in FIG. 5F. Referring to FIG. 5E, a distance D 466 is the distance from the center of the hypothetical hemispherical shape, circle or ellipse. A single parameter Distance Ratio$_H$ may be used to characterize the hemispherical shape as shown in the following equation:

$$DistanceRatio_H = \frac{2DistanceD}{\sqrt{Pitch^2 - TCD^2}} \quad\quad 1.05.00$$

where Distance D is the height of the center for a circle, Pitch is the pitch 472 of the repeating structure 460, and TCD is the top CD or TCD 468 of the structure 470. The single parameter Distance Ratio$_H$ has a range of values of 0.0 if the hemisphere is perfect circle on top of structure 470 to minus infinity when the hemisphere is a flat line, i.e., TCD is equal to the pitch 472, and 1 with the maximum allowed value where the adjacent structure contact each other.

FIGS. 6, 7, and 8 are block diagrams of exemplary methods for collecting and calculating sensitivity data and correlation data for profile parameters of repeating structures using optical metrology models, process simulation models, and historical or empirical data. With reference to FIG. 6, in step 500, an optical metrology model is developed for the semiconductor application. Development of the model is described above as part of generating a library of diffraction signals and associated profile parameters. In step 502, the optical metrology model is optimized by using a measured diffraction signal iteratively compared to simulated diffraction signals generated using a set profile parameters, altering one or more profile parameters in the set until the matching criteria for the measured diffraction signal versus the simulated diffraction signal are met. In step 504, sets of profile parameters are created for collecting sensitivity data, altering one or more profile parameters in each instance of the set. In step 506, the simulated diffraction signals based on the created set of profile parameters are calculated, using the techniques enumerated and discussed above such as RCWA, finite difference, and the like. The sensitivity of a profile parameter is calculated based on the ratio of the change in the simulated diffraction signal compared to the corresponding change in a profile parameter. For example, in a top-rounding example, the angle of an arc used to characterize the extent of top-rounding may be calculated by simulating the diffraction signal at two values of the arc angles, calculating the change using, as an example, the sum-squared error (SSE) or cost metric. Sensitivity is obtained by dividing the SSE or cost metric by the difference in the arc angles, where a high ratio means high sensitivity, and so on. For example, an SSE of equal to or less than 0.01 may be used as a sensitivity threshold for profile parameters of low sensitivity.

With reference to FIG. 7, in step 520, sensitivity data for each profile parameter is obtained through means such as described above in relation to FIG. 6. In step 522 of FIG. 7, the correlation measures for each profile parameter in relation to all the other profile parameters are calculated. Typically, a correlation coefficient is calculated using one or more of the well known formulas for correlation coefficients such as Pearson's r or Spearman's rho, or the like. Using the correlation measures calculated, in step 524, the profile parameters are ranked based on increasing correlation.

With reference to FIG. 8, sensitivity data for profile parameters may be obtained from process simulation of a semiconductor application, as in step 540. Process simulators such Prolith™, Raphael™, and the like may be used to provide dimensions of profile parameters. Sets of dimensions of profile parameters are then used to calculate the corresponding simulated diffraction signals. Historical data from a similar application may be used to provide a set of dimensions for a profile parameter, as in step 542. In step 544, the diffraction signal sensitivity is calculated based on data obtained either from process simulation or from historical data. In step 546, the correlation measures of each profile parameter compared to all other profile parameters are calculated.

Figure 9:
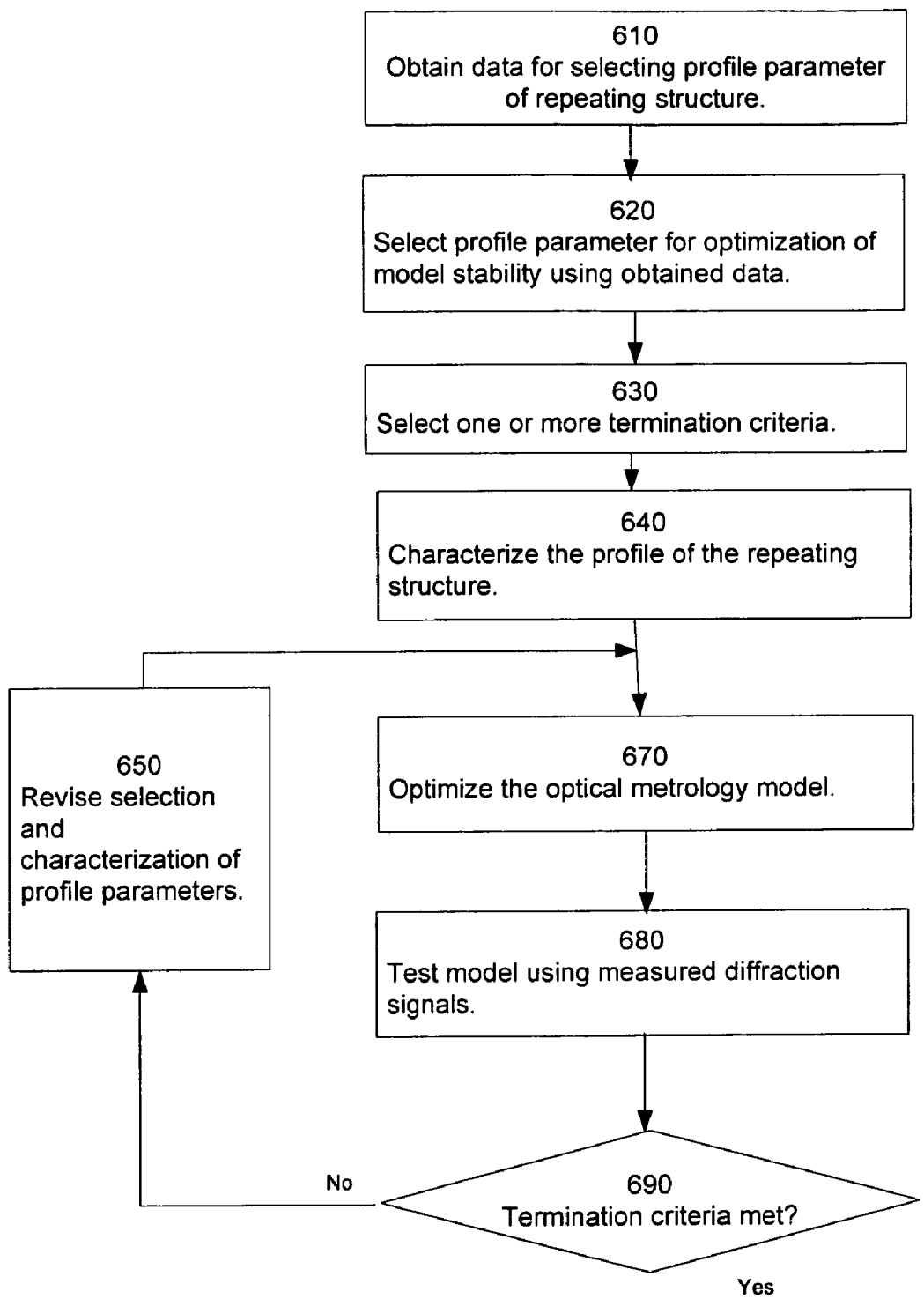
FIG. 9 is a block diagram of an exemplary method for optimizing an optical metrology model of a repeating structure to enhance model stability.

FIG. 9 is a block diagram of an exemplary method for optimizing an optical metrology model of a repeating structure to enhance model stability. In step 610, data needed for selecting profile parameters of repeating structures for enhancing model stability are obtained. This data include spectral sensitivity of the simulated diffraction signal to changes in the profile parameter and correlation of each profile parameter compared to all other profile parameters as discussed above. The sensitivity determined in FIG. 6 and the correlation calculated in steps 522 of FIG. 7 and 546 in FIG. 8 may be used in this step. In step 620, profile parameters for optimizing optical metrology model stability are selected using the data obtained in step 610. For example, low sensitivity may be used as criterion for selecting a profile parameter for stability optimization. If the extent of T-topping and/or the extent of footing of a structure has low spectral sensitivity, then T-topping or footing profile parameters would be selected. As discussed above, a sensitivity threshold of 0.01 SSE may be established as a measure for low sensitivity. In another example, high correlation of a profile parameter to other variables may be used as a criterion for selecting a profile parameter for stability optimization. Assume that profile parameters with high correlation coefficient, for example, r equal to or greater than 0.95, are selected. Typically, a correlation coefficient of 0.95 or higher is considered high correlation. If shape features such as undercutting or hemisphere have an r of 0.90 or greater, then both undercutting and hemisphere shape features would be selected. Another embodiment would include both low sensitivity and high correlation as criteria for selection. It is understood that other equivalent criteria may be combined as the bases for selection of profile parameters for optimization of model stability.

Referring to FIG. 9, in step 630, one or more termination criteria for the optimization are selected. The termination criteria may include measures of model stability such as extracted profile parameters falling within the established ranges, variance targets of extracted profile parameters compared to reference values, target ratios of maximum and minimum eigenvalues, singularity measures, and the like. One criterion is to test if the extracted profile parameters are physically possible as defined by ranges of the profile parameters. For example, if the structure profile includes a shape feature such as undercutting, the undercutting feature value should be equal to or less than the bottom width of the structure. Another test is whether the extracted profile parameters are accurate in relation to a reference metrology system extracted values. As an example, if the same structure was previously measured with a CDSEM, the extracted values using the optimized optical metrology model should be within a preset three sigma ($3\sigma$) value compared to the values obtained from the CDSEM. Other tests include comparing the extracted values to the range established for a profile parameter. For example, if the range of a sidewall angle of the profile is from 30 to 40 degrees, then the extracted values are compared to the range and statistical measures for the extracted values are compared to preset statistical measures for the sidewall angle. Other measures of model stability may be used such as condition of the metrics, ratio of maximum and minimum eigenvalues, and the like.

In step 640, the profile shape feature of the repetitive structure is characterized using one or more of the selected profile parameters in order to enhance model stability. Characterization includes deciding on the number of variables to express a shape feature or the number of basic polygons, ellipses or other primitive shapes to represent a shape. For example, top-view shape may be characterized with one large polygon or several polygons in order to better approximate the shape. In another example, a cross-sectional T-topping shape feature may be characterized as a combination of a structure width and two arcs or a distance ratio as shown in Equation 1.02.00. In step 670, the optical metrology model is optimized by iteratively simulating the diffraction signal associated with a set of values of the optical metrology model variables using a global and/or local optimization algorithm. This optimization step is configured to optimize the model based on the measures of model stability selected as termination criteria in step 630. For a more detailed explanation, refer to U.S. patent application Ser. No. 09/907,488, titled GENERATION OF A LIBRARY OF PERIODIC GRATING DIFFRACTION SIGNALS, filed on Jul. 16, 2001, which is incorporated herein by reference in its entirety.

Still referring to FIG. 9, in step 680, the stability of the model is tested using measured diffraction signals. Measured diffraction signals are obtained using an optical metrology device, such as an reflectometer, ellipsometers, and the like. The measured diffraction signals are used to extract the profile parameters using the library, regression, MLS methods discussed above or similar equivalent systems. Using the extracted profile parameters, the stability of the optical metrology model is tested by calculating the stability measures established as the termination criteria.

With reference to FIG. 9, in step 690, values of the calculated termination criteria are compared to the set values in step 640. If the termination criteria are not met, the selection and characterization of profile parameters are revised, step 650, and steps 670, 680 and 690 are iterated. Revision of selection criteria for the profile parameters may include using both sensitivity and correlation if only one was previously used. Another aspect may include setting a higher or lower correlation coefficient or a higher or lower measure of sensitivity than previously used. As mentioned above, revision of characterization of selected profile parameters may include reducing the number of profile parameters to represent a shape feature. Other embodiments include simplifying the characterization of a complicated shape to a distance ratio, changing representation of the structure overall cross-sectional profile or top-view profile to utilize fewer polygons and/or ellipses. Still other revisions may include substituting a fixed value for a profile parameter especially profile parameters with low spectral sensitivity or expressing a profile parameter as a function of another profile parameter if a significant correlation exists between the two profile parameters.

Figure 10:
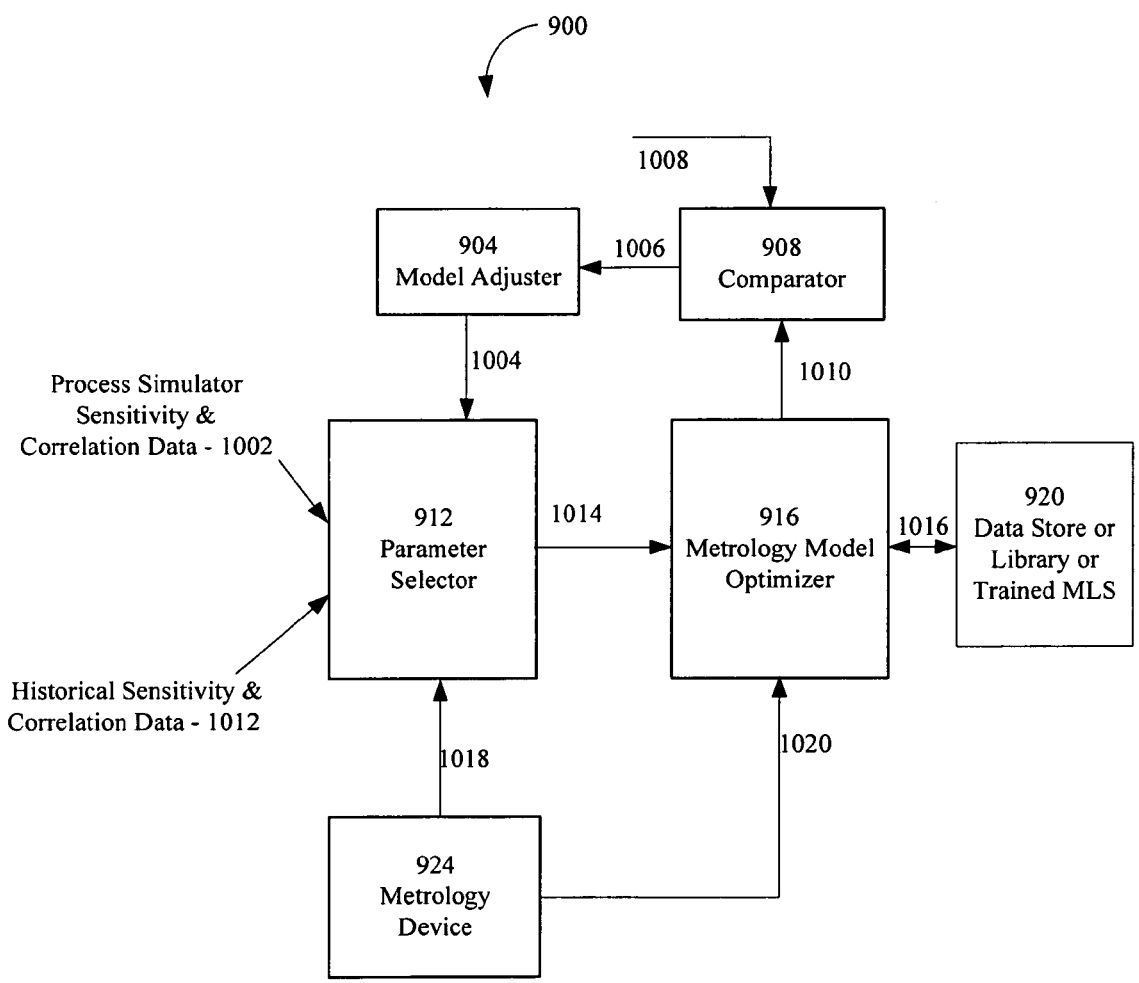
FIG. 10 is an exemplary system for optimizing an optical metrology model of a repeating structure to enhance model stability.

FIG. 10 is an exemplary system for optimizing an optical metrology model of a repeating structure to enhance model stability. The components of the exemplary system 900 comprises a model adjuster 904, a comparator 908, a parameter selector 912, an optical metrology model optimizer 916, a data store, library, or trained MLS 920, and an optical metrology device 924. The metrology device 924 is used to measure the diffraction signals off the repeating structure in a wafer (not shown), and transmits measured diffraction signals 1018 to the parameter selector 912 and measured diffraction signals 1020 to the optical metrology model optimizer 916. Other input to the parameter selector 912 include sensitivity and correlation data 1002 from process simulators and historical sensitivity and correlation data 1012. The parameter selector 912 selects and transmits profile parameters 1014 to the optical metrology model optimizer 916 for characterization of the profile. The optical metrology model is optimized by the optical metrology model optimizer 916 using one or more of the techniques described above. A data store of spectra and corresponding set of profile parameters, a library, or a trained MLS 920 may be created.

Referring still to FIG. 10, the comparator 908 calculates the actual values of the termination criteria from the extracted values of the profile parameters and compares the calculated termination criteria values to input termination criteria 1008. If the termination criteria are met, the optimization process ends, otherwise, the values of the termination criteria 1006 are transmitted to the model adjuster 904. The model adjuster 904 revises one or more selection criteria for use by the parameter selector 912 or revises one or more characterization of the profile parameters, for example, using substituting constant values for certain parameters instead of keeping these parameters variable, simplifying the representation of the top-view and/or the cross-sectional view of the repeating structure, or expressing a profile parameter in terms of one or more other profile parameter where a substantial correlation exists. Revisions and changes to the selection and characterization of the profile parameters 1014 are transmitted to the optical metrology model optimizer 916 and the optimization of the optical metrology model is iterated until the termination criteria are met. As mentioned above, the termination criteria comprise various measures of model stability.

Although exemplary embodiments have been described, various modifications can be made without departing from the spirit and/or scope of the present invention. For example, a first iteration may be run with a high number of profile parameters and other metrology variables allowed to float. After the first iteration, variables that do not produce significant changes to the diffraction response may be set to fixed values. Alternatively, variables initially considered constant due to previous empirical data may be allowed to float after further analyses. For example, the X-offset and Y-offset or the pitch angle may be initially held constant but may be allowed to float in successive iterations due to additional profile data obtained. Furthermore, instead of ellipses and polygons, other shapes may be utilized or the roughness of the shapes may be taken into account to provide a better or faster termination of the optimization process. Therefore, the present invention should not be construed as being limited to the specific forms shown in the drawings and described above but based on the claims below.

We claim:

1. A method of optimizing an optical metrology model for a repetitive structure, the optical metrology model having profile parameters, the method comprising:
   a) selecting one or more profile parameters using one or more selection criteria, the one or more selection criteria including sensitivity of simulated diffraction signals to changes of the selected profile parameters and/or correlation of a selected profile parameter to other profile parameters;
   b) setting one or more termination criteria, the one or more termination criteria comprising measures of stability of the optical metrology model;
   c) characterizing the profile shape features of the repetitive structure using the one or more selected profile parameters;
   d) optimizing the optical metrology model using a set of values for the one or more selected profile parameters;
   e) determining one or more profile parameters of the profile of the repetitive structure using the optimized optical metrology model and one or more measured diffraction signals, wherein the one or more measured diffraction signals were obtained by measuring diffraction signals from an actual repetitive structure using an optical metrology device;
   f) calculating values of the one or more termination criteria using the one or more determined profile parameters; and
   g) when the calculated values of the one or more termination criteria do not match the one or more set termination criteria, revising the selection of the one or more profile parameters and/or the characterization of the profile shape features of the repetitive structure, and iterating d), e), f), and g).

2. The method of claim 1 wherein the one or more selection criteria for selecting profile parameters include low sensitivity of diffraction signals resulting from changes of the selected profile parameter.

3. The method of claim 2 wherein sensitivity of diffraction signals is obtained from empirical sensitivity data, process simulation sensitivity data, or historical sensitivity data from similar fabrication recipes.

4. The method of claim 1 wherein the one or more selection criteria for selecting profile parameters include high correlation of a selected profile parameter to other profile parameters.

5. The method of claim 1 wherein the one or more selection criteria for selecting profile parameters include low sensitivity of diffraction signals and high correlation of a selected profile parameter to other profile parameters.

6. The method of claim 1 wherein the one or more termination criteria include determining if one or more of the determined profile parameters are physically possible.

7. The method of claim 6 wherein the determining if one or more of the determined profile parameters are physically possible comprises:
   comparing one or more of the determined profile parameters to ranges set for one or more of the profile parameters.

8. The method of claim 3 wherein the sensitivity of diffraction signals include cost function of two diffraction signals per unit change of the selected profile parameter or sum-squared error between two diffraction signals per unit change of the selected profile parameter.

9. The method of claim 4 wherein the correlation of diffraction signals includes correlation coefficients of a selected profile parameter compared to all other profile parameters.

10. The method of claim 1 wherein the one or more termination criteria include checking that profile parameters falling within the established ranges, that variance targets of determined profile parameters compared to reference values, target ratios of maximum to minimum eigenvalues, and/or singularity measures are met.

11. The method of claim 1 wherein characterizing the profile shape feature of the repetitive structure comprises:

utilizing mathematical algorithms that integrate physical dimension limits of the one or more selected profile parameters.

12. The method of claim 11 wherein the selected profile parameters include cross-sectional view parameters for shape features.

13. The method of claim 12 wherein cross-sectional view parameters for shape features includes top rounding, footing, undercutting, T-topping, and/or a hemisphere.

14. The method of claim 13 wherein the mathematical algorithm for cross-sectional view parameters for shape features includes distance ratio.

15. The method of claim 14 wherein the distance ratio is calculated using a length attribute of the shape feature and a proximate cross-sectional view profile parameter.

16. The method of claim 15 wherein the proximate cross-sectional view parameter includes one or more of a top critical dimension, a middle critical dimension, a bottom critical dimension, and/or radius of a hemisphere.

17. The method of claim 16 wherein:
if one shape feature includes top-rounding, the distance ratio is calculated using the horizontal length of the top-rounded feature on one side and the top critical dimension;
if one shape feature includes T-topping, the distance ratio is calculated using the horizontal length of the T-top feature on one side and the top critical dimension;
if one shape feature includes footing, the distance ratio is calculated using the horizontal length of the footing feature on one side and the bottom critical dimension;
if one shape feature includes undercutting, the distance ratio is calculated using the horizontal length of the undercut feature on one side and the top critical dimension, the middle critical dimension or the bottom critical dimension, and
if one shape feature includes a hemisphere, the distance ratio is calculated using the horizontal length of the radius of the hemisphere feature and the top critical dimension.

18. The method of claim 1 wherein the repetitive structure is a two-dimensional grating.

19. The method of claim 1 wherein the repetitive structure comprises contact holes, posts, vias, and/or trenches.

20. The method of claim 1 wherein the repetitive structure comprises two or more features in a unit cell.

21. The method of claim 1 wherein sensitivity of simulated diffraction signals to changes of the selected profile parameters and/or correlation of selected profile parameters to other profile parameters are determined by:
a) calculations using data obtained using an optical metrology model;
b) calculations using data obtained using process simulation; and/or
c) calculations using historical data from a similar application.

22. A method of extracting profile parameter values from measured diffraction signals off a repeating structure in a wafer, the method comprising:
a) selecting profile parameters using one or more selection criteria, the one or more selection criteria related to the capability of an optical metrology model to provide stable determinations of values for profile parameters from diffraction signals;
b) selecting one or more termination criteria, the one or more termination criteria comprising measures of stability of optical metrology model determination of profile parameters;
c) characterizing the profile of the repeating structure using one or more selected profile parameters taking into account physical limitations of the one or more selected profile parameters;
d) optimizing the optical metrology model;
e) determining profile parameters using the optimized optical metrology model and measured diffraction signals;
f) calculating values of the one or more termination criteria; and
g) when the calculated values of the one or more termination criteria do not match the one or more set termination criteria, revising the selection of the one or more profile parameters and/or the characterization of the profile shape features of the repetitive structure, and iterating d), e), f), and g).

23. The method of claim 22 wherein the one or more selection criteria for selecting profile parameters includes sensitivity of a diffraction signal resulting from a change of the selected profile parameter and/or correlation of the selected profile parameter to other profile parameters.

24. The method of claim 22 wherein selecting profile parameters using one or more selection criteria comprises:
obtaining sensitivity and/or correlation data for the selected profile parameters.

25. The method of claim 24 wherein obtaining sensitivity data comprises:
collecting sensitivity data of the selected profile parameters using historical data for similar applications or simulation data obtained using fabrication process simulators.

26. The method of claim 24 wherein the sensitivity data include cost function of two diffraction signals per unit change of the selected profile parameter and/or sum-squared error between two diffraction signals per unit change of the selected profile parameter.

27. The method of claim 23 wherein the correlation data include correlation coefficients of a selected profile parameter compared to all other profile parameters.

28. The method of claim 22 wherein characterizing the profile of the repeating structure comprises:
utilizing mathematical algorithms that integrate physical dimension limits of the selected profile parameters.

29. The method of claim 22 wherein the selected profile parameters include cross-sectional view parameters for shape features, the cross-sectional view parameters for shape features including top rounding, footing, undercutting, T-topping, and/or a hemisphere.

30. The method of claim 29 wherein the mathematical algorithm for cross-sectional view parameters for shape features includes distance ratio, the distance ratio calculated using a length attribute of the shape feature and a proximate cross-sectional view profile parameter.

31. The method of claim 30 wherein the proximate cross-sectional view parameter includes one or more of a top critical dimension, a middle critical dimension, a bottom critical dimension, and/or radius of a hemisphere, and wherein:
if one shape feature includes top-rounding, the distance ratio is calculated using the horizontal length of the top-rounded feature on one side and the top critical dimension;
if one shape feature includes T-topping, the distance ratio is calculated using the horizontal length of the T-top feature on one side and the top critical dimension;

if one shape feature includes footing, the distance ratio is calculated using the horizontal length of the footing feature on one side and the bottom critical dimension;

if one shape feature includes undercutting, the distance ratio is calculated using the horizontal length of the undercut feature on one side and the top critical dimension, the middle critical dimension or the bottom critical dimension; and if one shape feature includes a hemisphere, the distance ratio is calculated using the horizontal length of the radius of the hemisphere feature and the top critical dimension.

32. A system for optimizing selection of profile parameters of an optical metrology model for use in modeling repetitive structures in a wafer, the optical metrology model having profile parameters associated with a top-view of the structure and profile parameters associated with a cross-sectional view of the structure, the system comprising:

a parameter selector configured to:
develop an optical metrology model of the repetitive structure;
optimize the optical metrology model;
create, for each profile parameter of the optimized metrology model, a group containing sets of values of profile parameters of the optimized metrology model, wherein the each profile parameter is varied while holding all other profile parameters constant;
calculate a simulated diffraction signal for all the created sets of values for profile parameters using the optimized metrology model; and
calculate sensitivity data for the selected profile parameters or configured to calculate correlation data for the selected profile parameters;

an optical metrology model optimizer configured to:
select profile parameters using one or more selection criteria, the one or more selection criteria related to the capability of the optical metrology model to provide stable determinations of values for profile parameters from diffraction signals;
select one or more termination criteria;
characterize the profile of a repetitive structure using the selected profile parameters with a function including one or more profile parameters;
optimize the optical metrology model; and
test the optimized optical metrology model using measured diffraction signals; and calculate values of the one or more termination criteria;

a metrology device configured to measure diffraction signals off the repeating structure;

a comparator configured to determine if one or more termination criteria are met based on calculations using the optimized optical metrology model and the measured diffraction signals; and a model adjuster configured to revise the selection and/or characterization of the selected one or more profile parameters.

33. A computer-readable storage medium containing computer executable instructions for causing a computer to optimize selection of profile parameters of an optical metrology model for use in modeling repetitive structures in a wafer, the optical metrology model having profile parameters variables, comprising instructions for:

a) selecting one or more profile parameters using one or more selection criteria, the one or more selection criteria including sensitivity of simulated diffraction signals to changes of the selected profile parameters and/or correlation of a selected profile parameter to other profile parameters;

b) setting one or more termination criteria, the one or more termination criteria comprising measures of stability of the optical metrology model;

c) characterizing the profile shape features of the repetitive structure using the one or more selected profile parameters;

d) optimizing the optical metrology model using a set of values for the one or more selected profile parameters;

e) determining one or more profile parameters of the profile of the repetitive structure using the optimized optical metrology model and one or more measured diffraction signals, wherein the one or more measured diffraction signals were obtained by measuring diffraction signals from an actual repetitive structure using an optical metrology device;

f) calculating values of the one or more termination criteria using the one or more determined profile parameters; and g) when the calculated values of the one or more termination criteria do not match the one or more set termination criteria, revising the selection of the one or more profile parameters and/or the characterization of the profile shape features of the repetitive structure, and iterating d), e), f), and g).

* * * * *